(12) United States Patent
Saenger et al.

(10) Patent No.: US 9,448,489 B2
(45) Date of Patent: Sep. 20, 2016

(54) OPTICAL SYSTEM FOR A MICROLITHOGRAPHIC PROJECTION EXPOSURE APPARATUS AND MICROLITHOGRAPHIC EXPOSURE METHOD

(71) Applicant: Carl Zeiss SMT GmbH, Oberkochen (DE)

(72) Inventors: Ingo Saenger, Heidenheim (DE); Frank Schlesener, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/610,212

(22) Filed: Jan. 30, 2015

(65) Prior Publication Data
US 2015/0160566 A1   Jun. 11, 2015

Related U.S. Application Data

(63) Continuation of application No. PCT/EP2013/069458, filed on Sep. 19, 2013.

(60) Provisional application No. 61/706,824, filed on Sep. 28, 2012.

(30) Foreign Application Priority Data

Sep. 28, 2012 (DE) .................. 10 2012 217 769

(51) Int. Cl.
*G03B 27/72* (2006.01)
*G03B 27/54* (2006.01)
(Continued)

(52) U.S. Cl.
CPC ......... *G03F 7/70191* (2013.01); *G02B 5/3075* (2013.01); *G02B 17/002* (2013.01);
(Continued)

(58) Field of Classification Search
CPC .................. G03F 7/70108; G03F 7/70566

USPC ............................................ 355/53, 67–71
See application file for complete search history.

(56) References Cited

U.S. PATENT DOCUMENTS 6,191,880 B1   2/2001   Schuster
8,351,023 B2   1/2013   Deguenther
(Continued)

FOREIGN PATENT DOCUMENTS

DE          102 06 061 A1    9/2003
DE    10 2004 011 733 A1    9/2005
(Continued)

OTHER PUBLICATIONS

International Preliminary Report on Patentability for corresponding PCT Appl No. PCT/EP2013/069458, dated Apr. 9, 2015.
(Continued)

*Primary Examiner* — Hung Henry Nguyen
(74) *Attorney, Agent, or Firm* — Fish & Richardson P.C.

(57) ABSTRACT

The invention relates to an optical system for a microlithographic projection exposure apparatus, and to a microlithographic exposure method. An optical system for a microlithographic projection exposure apparatus comprises at least one mirror arrangement having a plurality of mirror elements, wherein these mirror elements can be adjusted independently of one another for changing an angular distribution of the light reflected by the mirror arrangement, and a polarization-influencing optical arrangement which is arranged downstream of the mirror arrangement in the light propagation direction, wherein the polarization-influencing optical arrangement reflects a light beam incident on the arrangement in at least two reflections, which do not occur in a common plane, for at least one angular distribution of the light reflected by the mirror arrangement.

30 Claims, 6 Drawing Sheets

(51) Int. Cl.
    *G03F 7/20*         (2006.01)
    *G02B 27/28*      (2006.01)
    *G02B 5/30*       (2006.01)
    *G02B 17/00*      (2006.01)
    *G02B 26/08*      (2006.01)

(52) U.S. Cl.
    CPC ......... *G02B26/0816* (2013.01); *G02B 27/286* (2013.01); *G03F 7/70116* (2013.01); *G03F 7/70566* (2013.01)

(56) References Cited

U.S. PATENT DOCUMENTS

| | | |
|---|---|---|
| 2005/0134825 A1 | 6/2005 | Schuster |
| 2006/0039006 A1* | 2/2006 | Van Der Pasch ...... G02B 5/122 356/493 |
| 2007/0146676 A1 | 6/2007 | Tanitsu et al. |
| 2007/0279613 A1 | 12/2007 | Fiolka et al. |
| 2008/0192225 A1 | 8/2008 | Mann et al. |
| 2010/0149504 A1 | 6/2010 | Deguenther |
| 2011/0063597 A1 | 3/2011 | Mengel |
| 2011/0122391 A1 | 5/2011 | Totzeck |
| 2011/0122392 A1 | 5/2011 | Fiolka et al. |
| 2011/0228247 A1* | 9/2011 | Mulder ............... G03F 7/70566 355/71 |
| 2011/0242517 A1 | 10/2011 | Mann et al. |
| 2013/0050673 A1 | 2/2013 | Saenger et al. |
| 2013/0077077 A1 | 3/2013 | Saneger et al. |
| 2014/0293254 A1* | 10/2014 | Komatsuda ......... G03F 7/70108 355/67 |

FOREIGN PATENT DOCUMENTS

| | | |
|---|---|---|
| DE | 10 2007 012 564 A1 | 9/2008 |
| DE | 10 2008 009 601 A1 | 8/2009 |
| DE | 10 2008 054 844 A1 | 7/2010 |
| DE | 10 2012 214 198 A1 | 5/2013 |
| DE | 10 2012 206 154 A1 | 6/2013 |
| EP | 1 306 665 A2 | 5/2003 |
| JP | 2008-538452 A | 10/2008 |
| JP | 2011-524642 A | 9/2011 |
| WO | WO 2005/026843 A2 | 3/2005 |
| WO | WO 2005/031467 A2 | 4/2005 |
| WO | WO 2005/069081 A2 | 7/2005 |
| WO | WO 2008/019936 A2 | 2/2008 |
| WO | WO 2009/034109 A2 | 3/2009 |
| WO | WO 2009/100862 A1 | 8/2009 |
| WO | WO 2011/021444 A1 | 2/2011 |

OTHER PUBLICATIONS

International Search Report for corresponding PCT Appl No. PCT/EP2013/069458, dated Feb. 5, 2014.

German Office Action, with translation thereof, for corresponding DE 10 2012 217 769.8, dated May 24, 2013.

Korean Office Action, with translation thereof, for corresponding KR Appl No. 10-2015-7005671, dated Mar. 23, 2016.

Japanese Office Action, with translation thereof, for corresponding JP Appl No. 2015-532407 dated, Dec. 24, 2015.

* cited by examiner

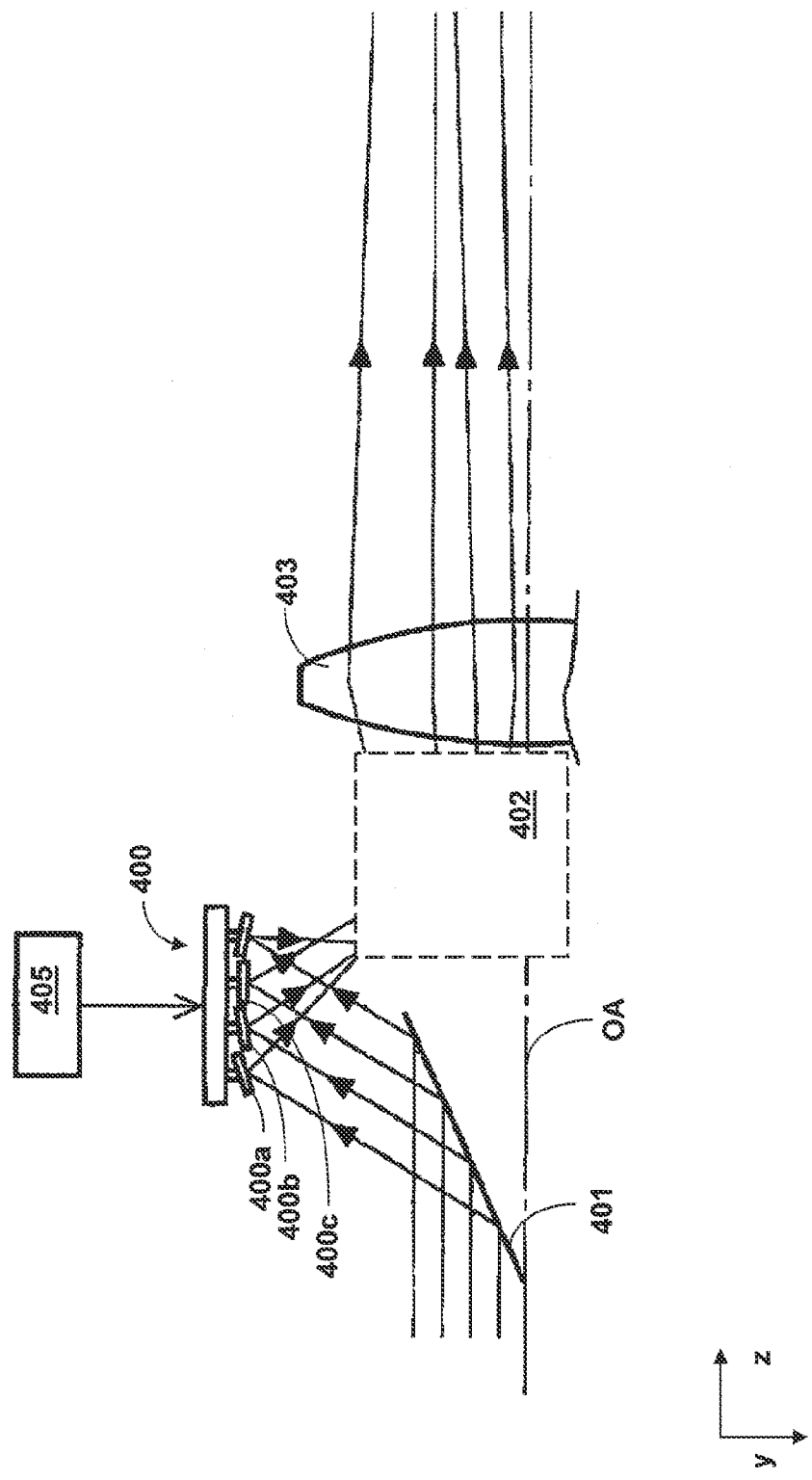

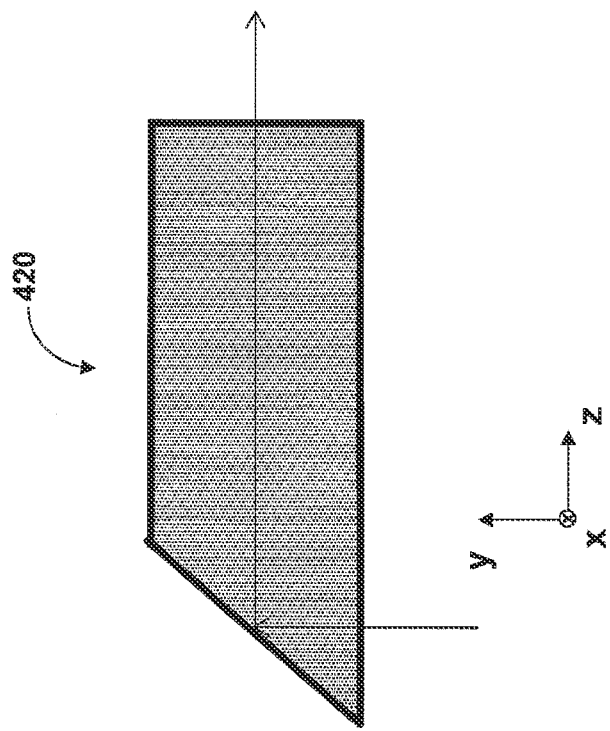
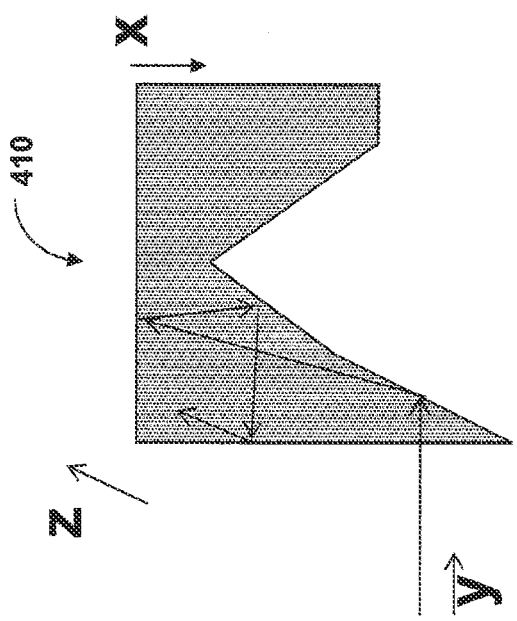

OPTICAL SYSTEM FOR A MICROLITHOGRAPHIC PROJECTION EXPOSURE APPARATUS AND MICROLITHOGRAPHIC EXPOSURE METHOD

CROSS REFERENCE TO RELATED APPLICATIONS

This application is a continuation of, and claims benefit under 35 USC 120 to, international application PCT/EP2013/069458, filed Sep. 19, 2013, which claims benefit under 35 USC 119 of German Patent Application DE 10 2012 217 769.8 and U.S. 61/706,824, both filed on Sep. 28, 2012. The entire disclosure of international application PCT/EP2013/069458 and German Application No. DE 10 2012 217 769.8 are hereby incorporated by reference herein.

BACKGROUND OF THE INVENTION

1. Field of the Invention

The invention relates to an optical system for a microlithographic projection exposure apparatus and to a microlithographic exposure method.

2. Prior Art

Microlithographic projection exposure apparatuses are used for producing microstructured components, such as, for example, integrated circuits or LCDs. Such a projection exposure apparatus comprises an illumination device and a projection lens. In the microlithography process, the image of a mask (=reticle) illuminated with the aid of the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus, there is a need to set defined illumination settings, i.e. intensity distributions in a pupil plane of the illumination device, in a targeted manner. Alongside the use of diffractive optical elements (so-called DOEs), the use of mirror arrangements is also known for this purpose, e.g. from WO 2005/026843 A2. Such mirror arrangements comprise a multiplicity of micro-mirrors that can be set independently of one another.

Furthermore, various approaches are known to set specific polarization distributions in the pupil plane and/or in the reticle in a targeted manner in the illumination device in order to optimize the imaging contrast.

In respect of the prior art, reference is made in an exemplary fashion to WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1, DE 10 2004 011 733 A1 and EP 1 306 665 A2.

SUMMARY OF THE INVENTION

It is an object of the present invention to provide an optical system for a microlithographic projection exposure apparatus and a microlithographic exposure method which, in a comparatively simple manner, enable flexible variation of the polarization distribution set in the projection exposure apparatus.

This object is achieved in accordance with the features of the independent claims.

An optical system according to the invention for a microlithographic projection exposure apparatus comprises:
- at least one mirror arrangement having a plurality of mirror elements, wherein these mirror elements can be adjusted independently of one another for changing an angular distribution of the light reflected by the mirror arrangement; and
- a polarization-influencing optical arrangement which is arranged downstream of the mirror arrangement in the light propagation direction;
- wherein the polarization-influencing optical arrangement reflects a light beam incident on the arrangement in at least two reflections, which do not occur in a common plane, for at least one angular distribution of the light reflected by the mirror arrangement.

In particular, proceeding from the use of a mirror arrangement with mirror elements that can be adjusted independently of one another, serving for varying the intensity distribution, the invention is based on the concept of providing the option for flexibly setting different polarization distributions beyond setting the intensity distribution by virtue of a plurality of reflections, not all lying in a common plane, occurring in a polarization-influencing optical arrangement following the mirror arrangement with the result that a geometric polarization rotation is obtained.

This polarization rotation can be traced back to a geometric effect known per se and is also referred to as "spin-redirection phase" or "Berry phase". The effect can be traced back to the fact that, in an optical system, the coordinate system for a given polarization state is rotated for skew light beams, i.e. beams which leave the meridional plane, from the entry area to the exit area of the optical system. As a result of this rotation of the coordinate system, a polarized beam is likewise rotated in its preferred polarization direction, even if there is no optical rotator (i.e., in particular, no linearly birefringent or circularly birefringent or optically active element) in the system and also if there is no polarization rotation due to s/p-splitting or via a polarizer.

In particular, the invention makes use of the fact that the light beams incident on the mirror arrangement with mirror elements that can be set independently of one another can in each case be directed to a point in the pupil plane of the optical system by varying the deflection angle respectively set by the mirror elements on different beam paths along the polarization-influencing optical arrangement, with the occurring geometric polarization rotation differing in each case. As a result, there can be flexible setting of the polarization distribution, even without the presence of (linearly or circularly) birefringent optical elements in the optical system.

In accordance with one embodiment, the polarization-influencing optical arrangement reflects a light beam incident on the arrangement in at least three reflections, which do not all occur in a common plane, for at least one angular distribution of the light reflected by the mirror arrangement.

In accordance with one embodiment, at least one of these reflections is a total-internal reflection. In particular, all of these reflections can be total-internal reflections. This allows light losses in the region of the polarization-influencing optical arrangement to be minimized or entirely avoided.

In accordance with one embodiment, the polarization-influencing optical arrangement consists of an optical element transmissive to light with the work wavelength of the optical system. This optical element preferably does not have birefringence (in particular no intrinsic birefringence either and also no stress birefringence either) so that the occurring polarization rotation only, and in a well-defined manner, consists in the form of the above-described geometric polarization rotation. The optical element can, in particular, be produced from an optically amorphous material, in particular fused silica ($SiO_2$).

In accordance with one embodiment, the polarization-influencing optical arrangement has a substantially rod-shaped geometry.

In accordance with one embodiment, the polarization-influencing optical arrangement has a light-entry area, a light-exit area and a plurality of side areas, wherein the reflections at each case occur at one of these side areas. Here, some of these side areas can also form a hollow profile within the polarization-influencing optical arrangement.

In accordance with one embodiment, the polarization-influencing optical arrangement has at least two mirrors, wherein the reflections at each case occur at one of these mirrors.

In accordance with one embodiment, for the at least one angular distribution of the light reflected by the mirror arrangement, at least one light beam has the same direction after the last one of the reflections and when leaving the polarization-influencing optical arrangement as during incidence on the polarization-influencing optical arrangement.

In accordance with one embodiment, the optical system, in relation to the light propagation direction, respectively has one deflection device upstream and downstream of the mirror arrangement. Here, in particular, the deflection device arranged upstream of the mirror arrangement can be formed by a deflection mirror and the deflection device arranged downstream of the mirror arrangement can be formed by the polarization-influencing optical arrangement.

The invention is not restricted to the application at work wavelengths in the VUV range (less than 250 nm, in particular less than 200 nm, more particularly less than 160 nm). In principle, an implementation in the EUV (i.e. at wavelengths of less than 30 nm, in particular less than 15 nm) is possible.

The invention furthermore relates to a microlithographic exposure method, in which light, generated by a light source, of an illumination device of a projection exposure apparatus is supplied for illuminating an object plane of a projection lens and in which the object plane is imaged in an image plane of the projection lens via the projection lens, wherein at least one mirror arrangement, which has a plurality of mirror elements that can be adjusted independently of one another for changing an angular distribution of the light reflected by the mirror arrangement, is used in the illumination device and wherein a light beam reflected by the mirror arrangement is reflected in at least two reflections, which do not occur in a common plane, for at least one angular distribution of the light reflected by the mirror arrangement.

Further embodiments of the invention can be gathered from the description and the dependent claims.

The invention will be explained in more detail below on the basis of exemplary embodiments depicted in the attached figures.

BRIEF DESCRIPTION OF THE DRAWINGS

In the figures:

FIGS. 4*a*-4*c* show schematic illustrations for explaining further embodiments of the present invention.

DETAILED DESCRIPTION OF PREFERRED EMBODIMENTS

Figure 5:
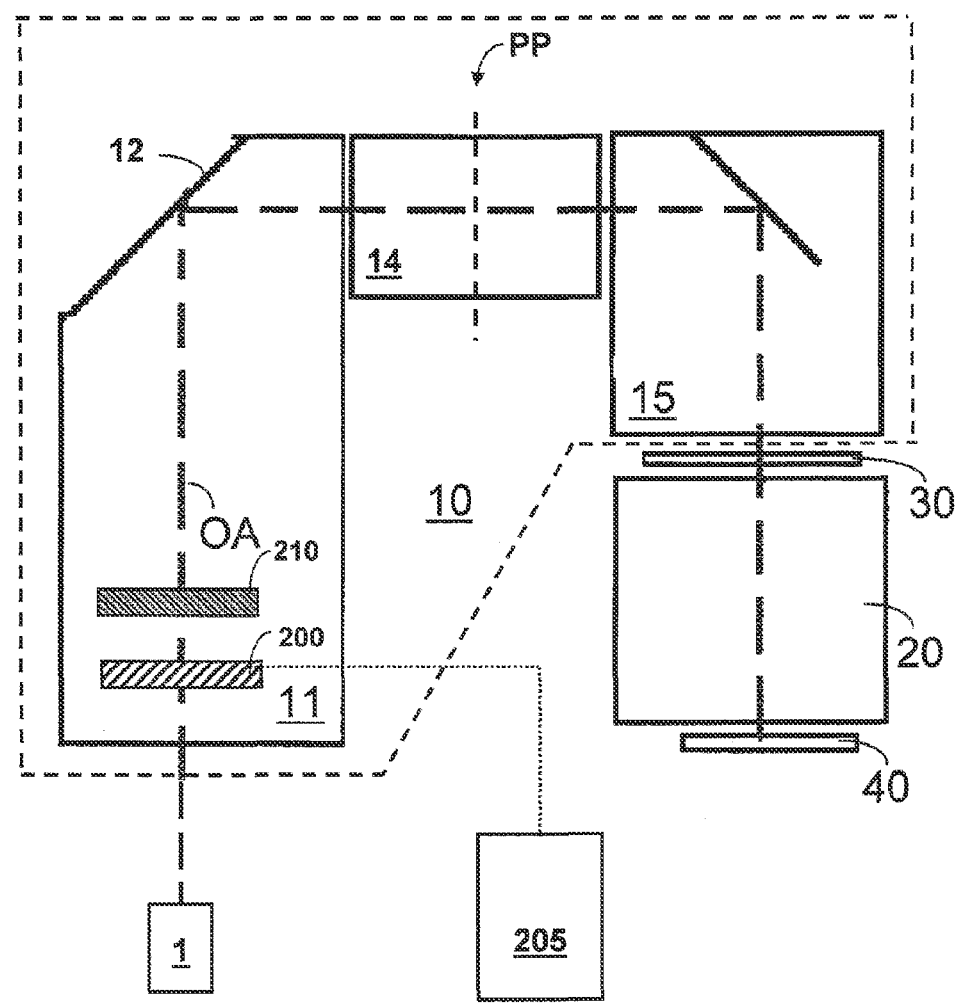
FIG. 5 shows a schematic illustration for explaining the possible design of a microlithographic projection exposure apparatus with an optical system according to the invention.

In the following text, a design of a microlithographic projection exposure apparatus with an optical system according to the invention which is possible in principle is explained with reference to FIG. 5. The projection exposure apparatus in accordance with FIG. 5 has an illumination device 10 and a projection lens 20. The illumination device 10 serves for illuminating a structure-carrying mask (reticle) 30 using light from a light-source unit 1, which for example comprises an ArF excimer laser for a work wavelength of 193 nm and a beam shaping optical unit generating a parallel bundle of light. In general, the illumination device 10 and the projection lens 20 are preferably designed for a work wavelength of less than 250 nm, in particular of less than 200 nm, more particularly less than 160 nm. In further embodiments, the illumination device and the projection lens of the projection exposure apparatus can also be designed for operation in the EUV, i.e. at wavelengths of the less than 30 nm, in particular of less than 15 nm.

In accordance with the invention, a mirror arrangement 200 and a polarization-influencing optical arrangement 210, as is explained in more detail below with reference to FIG. 1 ff., are, in particular, components of the illumination device 10. The mirror arrangement 200 has—as indicated schematically in e.g. FIG. 2—a plurality of mirror elements 200*a*, 200*b*, 200*c*, . . . that can be adjusted independently of one another for changing an angular distribution of the light reflected by the mirror arrangement 200. In accordance with FIG. 5, provision can be made for an actuation unit 205 for actuating these adjustments via suitable actuators. The mirror elements 200*a*, 200*b*, 200*c*, . . . can be tilted, individually in each case, over e.g. an angular range of −2° to +2°, in particular −5° to +5°, more particularly −10° to +10°. Upstream of the mirror arrangement 200 in the light propagation direction, provision can be made, in a manner known per se, for a micro-lens arrangement (not illustrated), which has a multiplicity of micro-lenses for targeted focusing on the mirror elements 200*a*, 200*b*, 200*c*, . . . and for reducing or avoiding illumination of a "dead area" and a loss of light between the mirror elements 200*a*, 200*b*, 200*c*, . . . .

The illumination device 10 has an optical unit 11 which, inter alia, comprises a deflection mirror 12 in the depicted example. Downstream of the optical unit 11 in the light propagation direction and in the beam path there is a light-mixing device (not illustrated) which can, for example in a manner known per se, have an arrangement of micro-optical elements suitable for obtaining a light mixture and there also is a lens group 14, behind which there is a field plane with a reticle masking system (REMA) which is imaged onto the structure-carrying mask (reticle) 30 situated in a further field plane by a REMA lens 15 following in the light propagation direction and, as a result thereof, delimits the illuminated region on the reticle. The structure-carrying mask 30 is imaged onto a wafer or a substrate 40 provided with a light-sensitive layer by the projection lens 20. The projection lens 20 can, in particular, be designed for immersion operation. Furthermore, it can have a numerical aperture NA of greater than 0.85, in particular of greater than 1.1.

Figure 1:
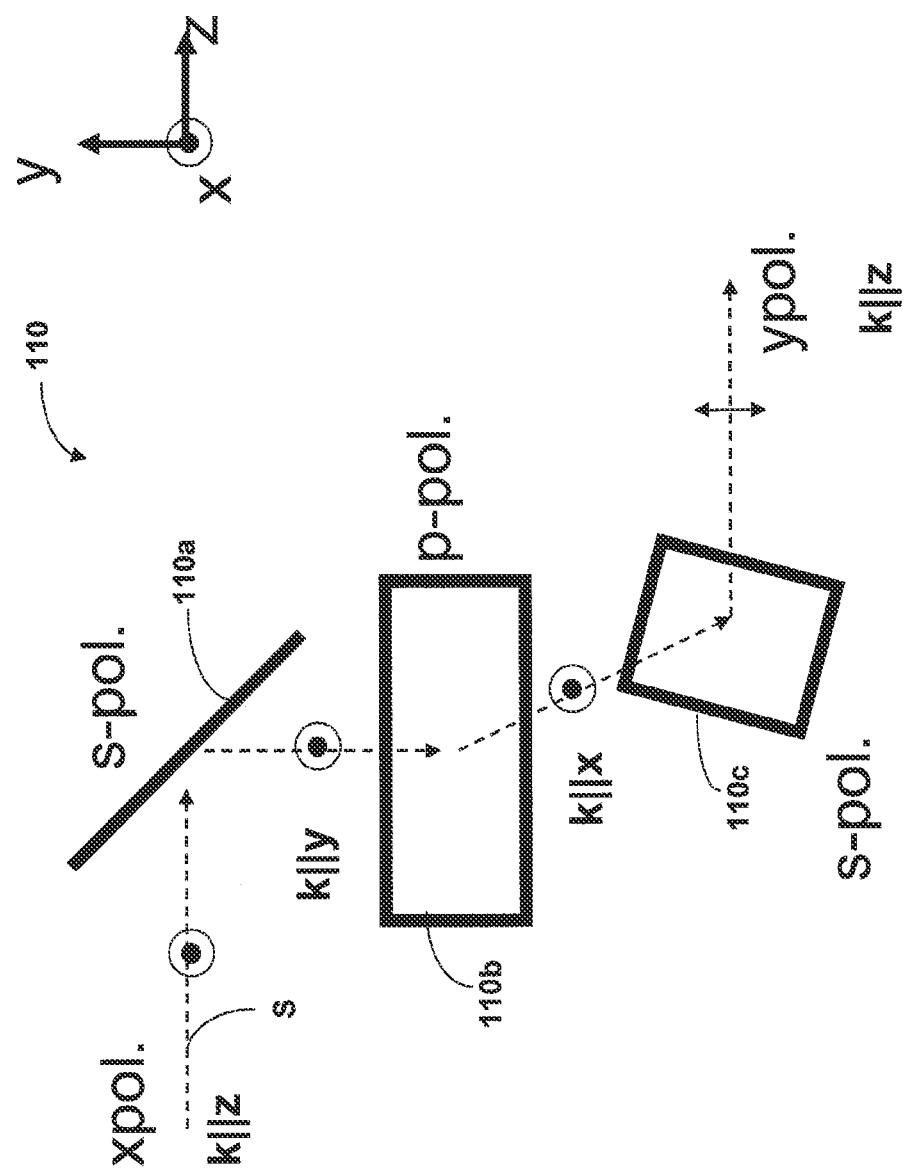
FIG. 1 shows a schematic illustration for explaining the functional principle of a polarization-influencing optical arrangement utilized in accordance with the invention.

FIG. 1 initially serves for explaining the principle of a polarization-influencing optical arrangement 110 employed in accordance with the invention. In accordance with FIG. 1 and in a merely exemplary embodiment, the polarization-influencing optical arrangement 110 has three mirrors 110a, 110b and 110c, via which a beam S incident on the polarization-influencing optical arrangement 110 from the mirror arrangement (not illustrated in FIG. 1) situated upstream thereof, as described above, experiences three successive reflections via which, overall, a geometric rotation of the polarization direction of the beam S is achieved.

In accordance with FIG. 1, the beam S is initially reflected in the negative y-direction in relation to the plotted coordinate system (i.e. downward within the plane of the drawing) at the first mirror 110a, subsequently reflected in the positive x-direction (i.e. perpendicularly out of the plane of the drawing) at the second mirror 110b and finally reflected in the positive z-direction (i.e. toward the right in the plane of the drawing) at the third mirror 110c, whereupon the beam S once again has the original propagation direction when leaving the polarization-influencing optical arrangement 110. However, the polarization direction of the beam S was rotated geometrically (and, in particular, without the use of linear or circular birefringence) by 90° compared to the input polarization direction (namely from an original "x-polarization", i.e. a linear polarization with an oscillation plane of the electric field strength vector extending along the x-axis, to an ultimately obtained y-polarization, i.e. a linear polarization with an oscillation plane of the electric field strength vector extending along the y-axis) as a result of the reflections occurring in different planes.

The invention is not restricted to the three reflections which occur in the example described above. In particular, the invention is not restricted to the "pure" generation of s- or p-polarization, plotted in each case in FIG. 1, and so other skew reflections which obtain different output polarizations in each case can also occur in further exemplary embodiments. Furthermore, it is not necessary for all of the reflections occurring within the polarization-influencing optical arrangement to take place in different planes (such that, for example, in the case of at least three reflections, the first and the last reflection can also occur in the same plane). Moreover, it is also possible—as described below with reference to FIG. 2—for there only to be two reflections within the polarization-influencing optical arrangement.

As a result of exclusive use being made of reflecting elements in the polarization-influencing optical arrangement 110 in the exemplary embodiment of FIG. 1, this embodiment is, in principle, also realizable in an optical system designed for operation in the EUV.

In further embodiments, the polarization-influencing optical arrangement—as described below with reference to FIG. 2 ff.—can also consist of an optical element transmissive to light of the respective work wavelength of the optical system.

Figure 2:
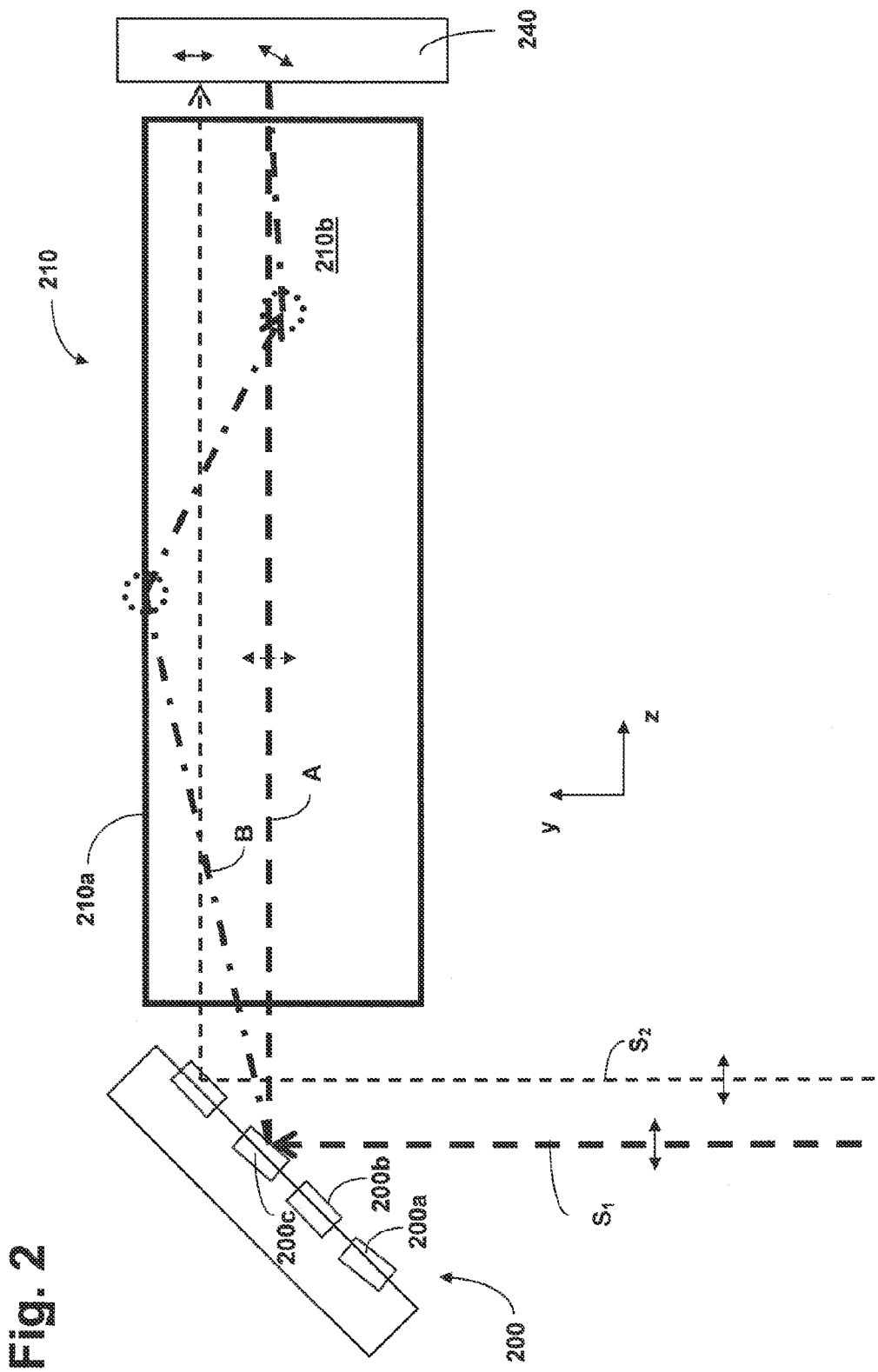
FIGS. 2-3 show schematic illustrations for explaining further embodiments of the present invention.

FIG. 2 shows a schematic illustration for explaining a further embodiment of the invention. In accordance with FIG. 2, a polarization-influencing optical arrangement 210, arranged downstream of the mirror arrangement 200 having the mirror elements 200a, 200b, 200c, . . . that can be adjusted independently of one another in relation to the light propagation direction (extending along the z-direction in the plotted coordinate system), is embodied as a rod and made of material such as fused silica ($SiO_2$) which is transmissive to light at the work wavelength (e.g. approximately 193 nm), which material moreover does not, where possible, have birefringence (i.e., in particular, no stress birefringence or intrinsic birefringence either).

As indicated in FIG. 2, light beams, which enter the rod forming the polarization-influencing optical arrangement 210 through an end area, can pass through the rod along different beam paths depending on the deflection angles set by the mirror elements 200a, 200b, 200c, . . . . In the specific example, it is possible, for example, for a beam $S_1$ reflected at the mirror element 200c to reach one and the same location in the pupil plane or one and the same location on an optical element 240 arranged in the pupil plane along a direct beam path, denoted by "A" in FIG. 2 (i.e. without reflection at the side areas of the rod), or else after reflecting at several side areas of the rod (at the "upper" side area 210a and the "front" side area 210b in the example), for example along the beam path denoted by "B" in FIG. 2. Whereas there is no influence on the polarization direction along the "direct" beam path "A"—as a result of the lack of birefringence in the rod material as described above—there is a geometric polarization rotation along the beam path "B", selected in the example above, as a result of the "skew" reflections occurring at the side areas 210a, 210b.

Here, the entry angle when light enters into the rod, which is set by the mirror elements 200a, 200b, 200c, . . . of the mirror arrangement 200, is preferably selected in each case such that the above-described reflections are total-internal reflections at each case, as a result of which all light entering the rod remains within this rod during the course of the occurring reflections while avoiding light losses and only emerges from the rod after the last reflection. In other words, the respectively applicable boundary angle for total-internal reflection relating to the normal in relation to the reflecting area should be obtained or exceeded for every light beam (with the exception of at the light exit area) incident on the side areas or interfaces within the transmissive optical element forming the polarization-influencing optical arrangement 210.

As a result, it is also possible to bring about flexible setting of the polarization obtained in a plane after the polarization-influencing optical arrangement 210 in the exemplary embodiment of FIG. 2 by varying the deflection angle set by the mirror elements 200a, 200b, 200c, . . . of the mirror arrangement 200.

Figure 3:
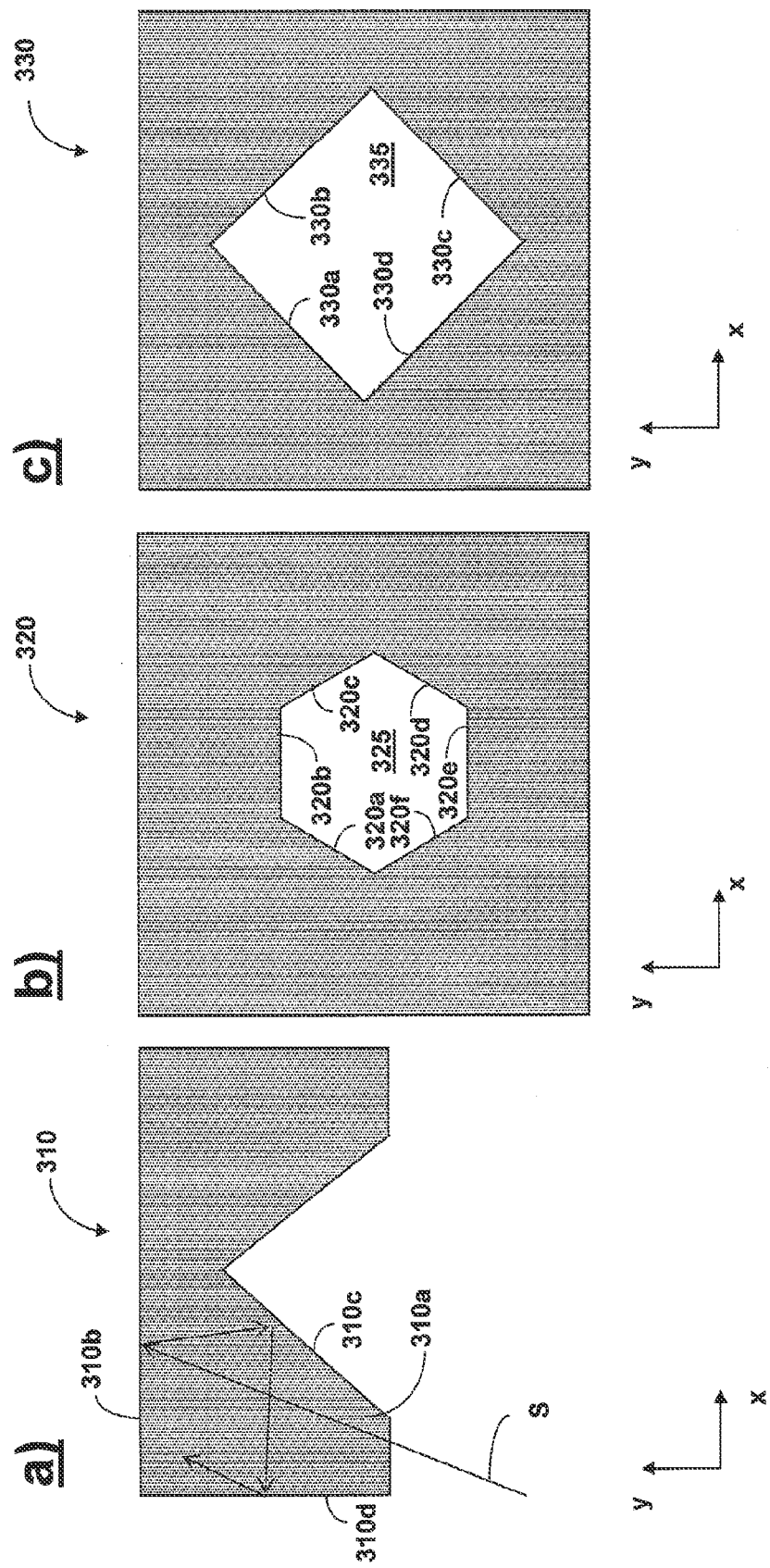

FIG. 3a-c show further embodiments of a polarization-influencing optical arrangement which can be employed in an optical system according to the invention. Like in the exemplary embodiment of FIG. 2, the polarization-influencing optical arrangement in this case has a light entry area, a light exit area and a plurality of side areas, wherein the reflections at each case occur at one of these side areas. In accordance with the exemplary embodiment of FIG. 3b, the side areas 320a-320f moreover form a hexagonal hollow profile 325 within the polarization-influencing optical arrangement 320, whereas, in accordance with the exemplary embodiment of FIG. 3c, the side areas 330a-330d form a square hollow profile 335 within the polarization-influencing optical arrangement 330.

As indicated on the basis of a beam profile which is indicated in a purely exemplary manner in FIG. 3a, light respectively enters the end area (arranged in the xy-plane) of the transmissive element which forms the polarization-influencing optical arrangement and is shaded in the illustration during the operation of the optical system, wherein the mirror elements 200a, 200b, 200c, . . . of the mirror arrangement 200 (which are not plotted in FIG. 3a-c but have a design analogous to FIG. 2 and are arranged upstream of the transmissive element in relation to the light propagation direction) can be used to set different entry angles (i.e. different angles of inclination to the z-axis extending perpendicular to the entry area). These angles of inclination in turn result in different successive reflections on the side areas (i.e. the interfaces to the respectively surrounding optically thinner medium) depending on the specific geometry of the respective transmissive optical element, which in turn leads to different values of the geometric polarization rotation ultimately brought about by the transmissive optical element forming the polarization-influencing optical arrangement.

During the operation of the optical system having the polarization-influencing optical arrangement, it is now possible for a specific desired output polarization of the light incident on a specific location in the pupil plane to establish, e.g. via simulation, a succession of reflections suitable for generating this polarization state via a geometric polarization rotation and, in turn, the deflection suitable for this to be brought about by the mirror arrangement 200, whereupon the actuation of the mirror elements 200a, 200b, 200c, . . . of the mirror arrangement 200 can be undertaken in an appropriate manner (e.g. by the actuation unit 205).

In the specific example of FIG. 3a, a beam "S" entering the transmissive optical element through the end area 310a is successively reflected on the side areas 310b, 310c and 310d, before it emerges through the light exit area.

Analogously to the embodiment described above with reference to FIG. 2, the entry angle set by the mirror elements 200a, 200b, 200c, . . . of the mirror arrangement 200 when light enters the respective transmissive element forming the polarization-influencing optical arrangement is, also in accordance with FIG. 3a-c, preferably selected such that the reflections occurring at the interfaces are in each case total-internal reflections, resulting in all light entering into the transmissive element remaining within this element over the course of the occurring reflections while avoiding light losses and only emerging from the element after the last reflection. In other words, the respectively applicable boundary angle for total-internal reflection relating to the normal in relation to the reflecting area should, also in accordance with FIG. 3a-c, be obtained or exceeded for every light beam (with the exception of at the light exit area) incident on the side areas or interfaces within the relevant transmissive optical element forming the polarization-influencing optical arrangement.

Depending on the specific geometry of the transmissive element forming the polarization-influencing optical arrangement (for example with the geometries illustrated in FIGS. 3b and 3c or with other geometries), it is now possible for the respective entry angles set by the mirror elements 200a, 200b, 200c, . . . of the mirror arrangement 200 to provide different successive reflections at the interfaces to the respectively surrounding optical thinner medium and hence to provide different geometric polarization rotations.

In further embodiments, the successive reflections which occur in accordance with FIG. 3a-c and are employed for geometric polarization rotation can also be realized by virtue of the polarization-influencing optical arrangement, deviating from FIG. 3a-c, being embodied without material in the region respectively shaded and with reflecting areas or mirrors forming the interfaces in each case (which then as it were delimit a hollow tube with an arbitrary predetermined cross section). As a result of the embodiment with reflective elements, this embodiment can then, in principle, analogous to FIG. 2, also be realized in an optical system designed for operation in the EUV.

In order likewise to minimize a light loss in the embodiment described above with reflective elements in each case, the entry angle into the polarization-influencing optical arrangement set by the mirror elements 200a, 200b, 200c, . . . of the mirror arrangement 200 is preferably selected such that the reflections occurring at the reflecting areas of the polarization-influencing optical arrangements occur as completely as possible or with minimal s/p-split, for which purpose, in turn, the angles of incidence on the respective reflecting areas should have values which are as small as possible (i.e. grazing incidence), e.g. less than 30°, in particular less than 20°, more particularly less than 20° in relation to the reflecting area.

Moreover, a suitable coating can be provided on the relevant reflecting areas for minimizing the s/p-split or for maximizing the reflections at the used angle range in embodiments of the invention, which coating can be embodied in the form of any known HR layer when the optical system is designed for VUV (e.g. for a work wavelength of less than 250 nm, in particular less than 200 nm) and e.g. as ruthenium coating or as molybdenum/silicon multiple layer for a work wavelength in the EUV.

FIG. 4a shows a schematic illustration for explaining a further possible application of the invention in an illumination device which likewise has a mirror arrangement 400 with a plurality of mirror elements 400a, 400b, 400c, . . . that can be adjusted independently of one another.

In accordance with FIG. 4a, a deflection device 401, 402 is respectively provided upstream and downstream of the mirror arrangement 400 in the light propagation direction, wherein the deflection device 401 arranged upstream of the mirror arrangement 400 is formed by a deflection mirror and wherein the deflection device 402 arranged downstream of the mirror arrangement 400 is formed by a polarization-influencing optical arrangement analogous to the embodiments described with reference to FIG. 3a-c. Exemplary embodiments of such a polarization-influencing optical arrangement, which simultaneously acts as deflection device 402, are illustrated schematically in FIGS. 4b and 4c. The arrangements 410, 420 shown in FIG. 4b and FIG. 4c on the one hand assume the function of the deflection device 402 present in the beam path of FIG. 4a and, on the other hand, assume—in this respect analogously to the embodiments of FIGS. 3a to 3c or FIG. 2—the generation of the desired (output) polarization state via geometric polarization rotation during the succession of reflections occurring in the relevant arrangement 410, 420. In FIG. 4c, only the beam deflection itself is indicated here for reasons of simplicity, wherein the geometric polarization rotation takes place analogously to the above description of the exemplary embodiment of FIG. 2 (with the mirror arrangement 200 being replaced by the first reflecting side area of the polarization-influencing optical arrangement 420 plotted on the left in FIG. 4c).

Referring back to FIG. 4a, the deflection device 401 arranged upstream of the mirror arrangement 400 deflects the illumination light initially propagating along the optical system axis OA (i.e. in z-direction) in the direction toward the mirror arrangement 400 via reflection, whereupon—after reflection at the mirror elements 400a, 400b, 400c, . . . of the mirror arrangement 400—there once again is a deflection in a direction approximately parallel to the optical system axis OA to the additional components 403, . . . provided in the illumination device by a reflection at the second deflection device 402 (or as a result of the beam deflection by the polarization-influencing optical arrangement 410, 420 in accordance with FIG. 4b, 4c).

Analogous to the embodiments of FIG. 3a-c, the mirror elements 400a, 400b, 400c, . . . of the mirror arrangement 400 can be adjusted by an actuation unit 405 in order thereby to provide different successive reflections within the polarization-influencing optical arrangement forming the second deflection device 402 by varying the entry angles and thereby create the option for flexibly setting different polarization distributions in a subsequent plane, e.g. in the pupil plane.

Even though the invention has been described on the basis of specific embodiments, numerous variations and alternative embodiments are evident to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system, comprising:
   a mirror arrangement comprising a plurality of mirror elements which are independently adjustable to change an angular distribution of light reflected by the mirror arrangement during use of the optical system; and
   a polarization-influencing optical arrangement downstream of the mirror arrangement along a path that light follows through the optical system during use of the optical system,
   wherein:
      the optical system is a microlithographic optical system;
      the optical system is configured so that, during use of the optical system:
         for an angular distribution of light reflected by the mirror arrangement, the polarization-influencing optical arrangement reflects a light beam incident on the polarization-influencing arrangement in at least two reflections which do not occur in a common plane;
      the at least two reflections of the light beam comprise a first reflection of the light beam and a second reflection of the light beam;
      the first reflection of the light beam occurs in a first plane; and
      the second reflection of the light beam occurs in a second plane which is non-parallel to the first plane.

2. The optical system of claim 1, wherein during use of the optical system:
   for an angular distribution of the light reflected by the mirror arrangement, the polarization-influencing optical arrangement reflects a light beam incident on the polarization-influencing optical arrangement in at least three reflections which do not all occur in a common plane.

3. The optical system of claim 1, wherein during use of the optical system:
   for an angular distribution of light reflected by the mirror arrangement, the polarization-influencing optical arrangement reflects a light beam incident on the polarization-influencing optical arrangement in at least three reflections which do not all occur in a common plane; and
   at least one of the at least three reflections is a total-internal reflection.

4. The optical system of claim 1, wherein during use of the optical system:
   for an angular distribution of light reflected by the mirror arrangement, the polarization-influencing optical arrangement reflects a light beam incident on the polarization-influencing optical arrangement in at least three total-internal reflections which do not all occur in a common plane.

5. The optical system of claim 1, wherein at least one of the reflections is a total-internal reflection.

6. The optical system of claim 1, wherein two of the reflections are total-internal reflections.

7. The optical system of claim 1, wherein the optical system has a work wavelength, and the polarization-influencing optical arrangement is transmissive to light having the work wavelength.

8. The optical system of claim 7, wherein the polarization-influencing optical element arrangement is non-birefringent.

9. The optical system of claim 7, wherein the polarization-influencing optical element arrangement comprises optically amorphous material.

10. The optical system of claim 7, wherein the polarization-influencing optical element arrangement comprises fused silica.

11. The optical system of claim 1, wherein the polarization-influencing optical arrangement is rod-shaped.

12. The optical system of claim 1, wherein:
   the polarization-influencing optical arrangement comprises a light entry area, a light exit area and a plurality of side areas; and
   each of the at least two reflections occurs at a side area of the polarization-influencing optical element.

13. The optical system of claim 12, wherein at least some of the side areas define a hollow profile within the polarization-influencing optical arrangement.

14. The optical system of claim 1, wherein:
   the polarization-influencing optical arrangement comprises at least two mirrors; and
   the optical system is configured so that, during use of the optical system, each of the at least two reflections occurs at a mirror.

15. The optical system of claim 1, wherein the polarization-influencing optical element is configured so that during use of the optical system, for the at least one angular distribution of light reflected by the mirror arrangement, at least one light beam has the same direction when leaving the polarization-influencing optical arrangement after a last reflection of the at least two reflections as the light beam had when initially incident on the polarization-influencing optical arrangement.

16. The optical system of claim 1, further comprising:
   a first deflection device upstream of the mirror arrangement along the path that light follows through the optical system during use of the optical system; and
   a second deflection device downstream of the mirror arrangement along the path that light follows through the optical system during use of the optical system.

17. The optical system of claim 16, wherein the second deflection device comprises a deflection mirror.

18. The optical system of claim 1, further comprising a deflection device upstream of the mirror arrangement along the path that light follows through the optical system during use of the optical system.

19. The optical system of claim 18, wherein the polarization-influencing optical arrangement comprises a further deflection device.

20. The optical system of claim 1, wherein the optical system is configured to be used with a work wavelength of less than 250 nm.

21. The optical system of claim 1, wherein the optical system is configured to be used with a work wavelength of less than 30 nm.

22. An apparatus, comprising:
an illumination device comprising an optical system; and
a projection lens,
wherein:
the apparatus is a microlithography projection exposure apparatus;
the optical system comprises:
a mirror arrangement comprising a plurality of mirror elements which are independently adjustable to change an angular distribution of light reflected by the mirror arrangement during use of the optical system; and
a polarization-influencing optical arrangement downstream of the mirror arrangement along a path that light follows through the optical system during use of the optical system;
the optical system is configured so that, during use of the optical system:
for an angular distribution of light reflected by the mirror arrangement, the polarization-influencing optical arrangement reflects a light beam incident on the polarization-influencing arrangement in at least two reflections which do not occur in a common plane;
the at least two reflections of the light beam comprise a first reflection of the light beam and a second reflection of the light beam;
the first reflection of the light beam occurs in a first plane; and
the second reflection of the light beam occurs in a second plane which is non-parallel to the first plane.

23. A method of operating a microlithography projection objective comprising an illumination device and a projection lens, the illumination device comprising an optical system, the method comprising:
using the illumination device to illuminate at least a portion of a mask; and
using the projection lens to project at least a portion of the illuminated mask onto a light-sensitive material,
wherein the optical system is an optical system according to claim 1.

24. The optical system of claim 1, wherein:
after the first reflection of the light beam, the light beam propagates in a first direction having a vector in a first direction;
after the second reflection of the light beam, the light beam propagates in a second direction having a vector in a second direction; and
the first direction is non-parallel to the second direction.

25. An optical system, comprising:
a mirror arrangement comprising a plurality of mirror elements which are independently adjustable to change an angular distribution of light reflected by the mirror arrangement during use of the optical system; and
a polarization-influencing optical arrangement downstream of the mirror arrangement along a path that light follows through the optical system during use of the optical system,
wherein:
the optical system is a microlithographic optical system;
the optical system is configured so that, during use of the optical system: for an angular distribution of light reflected by the mirror arrangement, the polarization-influencing optical arrangement reflects a light beam incident on the polarization-influencing arrangement in at least two reflections which do not occur in a common plane;
the at least two reflections of the light beam comprise a first reflection of the light beam and a second reflection of the light beam; and
the optical system is configured so that the first and second reflections of the light beam occur sequentially.

26. The optical system of claim 1, wherein:
the first reflection occurs of the light beam at a first surface of the polarization-influencing arrangement; and
the second reflection occurs at a second surface of the polarization-influencing arrangement which is different from the first surface of the polarization-influencing arrangement.

27. The apparatus of claim 22, wherein:
after the first reflection of the light beam, the light beam propagates in a first direction having a vector in a first direction;
after the second reflection of the light beam, the light beam propagates in a second direction having a vector in a second direction; and
the first direction is non-parallel to the second direction.

28. An apparatus, comprising:
an illumination device comprising an optical system; and
a projection lens,
wherein:
the apparatus is a microlithography projection exposure apparatus;
the optical system comprises:
a mirror arrangement comprising a plurality of mirror elements which are independently adjustable to change an angular distribution of light reflected by the mirror arrangement during use of the optical system; and
a polarization-influencing optical arrangement downstream of the mirror arrangement along a path that light follows through the optical system during use of the optical system; and
the optical system is configured so that, during use of the optical system: for an angular distribution of light reflected by the mirror arrangement, the polarization-influencing optical arrangement reflects a light beam incident on the polarization-influencing arrangement in at least two reflections which do not occur in a common plane;
the at least two reflections of the light beam comprise a first reflection of the light beam and a second reflection of the light beam; and
the optical system is configured so that the first and second reflections of the light beam occur sequentially.

29. The apparatus of claim 22, wherein:
the first reflection of the light beam occurs at a first surface of the polarization-influencing arrangement; and
the second reflection of the light beam occurs at a second surface of the polarization-influencing arrangement which is different from the first surface of the polarization-influencing arrangement.

30. A method of operating a microlithography projection objective comprising an illumination device and a projection lens, the illumination device comprising an optical system, the method comprising:

using the illumination device to illuminate at least a portion of a mask; and using the projection lens to project at least a portion of the illuminated mask onto a light-sensitive material, wherein the optical system is an optical system according to claim 25.

* * * * *